United States Patent [19]

Keim

[11] Patent Number: 4,528,532
[45] Date of Patent: Jul. 9, 1985

[54] SWITCH FOR FINE ADJUSTMENT OF PERSISTENT CURRENT LOOPS IN SUPERCONDUCTIVE CIRCUITS

[75] Inventor: Thomas A. Keim, Clifton Park, N.Y.

[73] Assignee: General Electric Company, Schenectady, N.Y.

[21] Appl. No.: 553,212

[22] Filed: Nov. 18, 1983

[51] Int. Cl.³ .............................................. H01F 7/22
[52] U.S. Cl. .................................... 335/216; 200/262; 338/325
[58] Field of Search ........................ 200/262; 338/325; 335/216

[56] References Cited

U.S. PATENT DOCUMENTS

| | | | |
|---|---|---|---|
| 3,324,436 | 6/1967 | Mueller | 335/216 X |
| 3,359,394 | 12/1967 | Mains | 335/216 X |
| 3,486,079 | 12/1969 | Arp | 335/216 X |
| 3,513,421 | 5/1970 | Schindler et al. | 335/216 |

Primary Examiner—George Harris
Attorney, Agent, or Firm—Lawrence D. Cutter; James C. Davis, Jr.; Marvin Snyder

[57] ABSTRACT

A small portion of a lead for a superconducting coil is made to function as a controllable resistor with a low resistance value and fast thermal response so as to be capable of rapidly being switched between the superconducting and resistive states. The device is thus capable of fine adjustment of the current flowing in a superconducting loop. The switch includes lengths of parallel conductor so that the resulting section of superconductive material is cryostable. The superconducting oil lead is disposed on a substrate so as to permit ready access for helium or other cryogenic coolant to most lead surfaces. The small mass and close contact with the coolant produce rapid turn-on and turn-off response characteristics. Furthermore, the low overall resistance causes the coil current to decay slowly, thus preventing precise control of the superconducting current.

9 Claims, 4 Drawing Figures

SWITCH FOR FINE ADJUSTMENT OF PERSISTENT CURRENT LOOPS IN SUPERCONDUCTIVE CIRCUITS

BACKGROUND OF THE INVENTION

The present invention is generally directed to switches for use in superconducting current paths. More particularly, the present invention is directed to a superconducting loop switch which is capable of exhibiting rapid turn-on and turn-off responses so as to be able to permit precise control of the current in the loop.

In applications requiring a highly stable magnetic field, such as in nuclear magnetic resonance (NMR) imaging or spectroscopy, it is customary to join the two ends of a superconducting electromagnet to each other through a length of superconductive material configured to operate as a superconducting switch. Any electrical joints in the circuit are also made to be superconducting so that once a current is established in such a magnet, it can be maintained constant for very long periods of time. The aforementioned switch is referred to herein as a main switch. It has two possible functions, both of which are based on its ability to be switched from a superconducting state to a conventional resistive state. This main switch is in effect connected across the terminals of the superconductive electromagnet. Once a power supply has established a desired current level in the superconducting loop, the main switch is switched from the resistive state to the superconducting state. Once this transition occurs, the current in the superconducting electromagnet coil can no longer change. The current from the power supply may be reduced to zero, establishing a current in the loop comprising the switch and the coil. This current is referred to as a persistent current the properties of which are more particularly described below. Additionally, the main switch may also be switched to the resistive state, for example by heating a part of the superconductive element. The main switch may actually be configured from part of the same superconductive conductor employed in the electromagnet coil or coils. It is desirable that the heater power required to maintain the superconductive switch in the resistive state be moderate, both to keep the switching power supply small and, more importantly to minimize coolant consumption (boil-off). Accordingly, the main switch is disposed so as to be thermally insulated from the cryogenic coolant. The present invention, however, is not directly concerned with the construction of this main switch, but rather with the construction of a second switch to be employed in the superconducting loop so as to be able to permit precise control of the superconducting current.

Although the superconducting phenomenon gives rise to very stable magnetic fields exhibiting deviations of less than one part in ten million per hour, the ability to initially determine the current and field value is limited by the power supply. In particular, the setability of the current and field level is limited by the setability of the power supply. Power supplies, particularly constant current power supplies, are generally limited to an accuracy of no more than one part in 1,000 or one part in 10,000. This is particularly true with respect to power supplies providing the level of superconductive current considered herein. Typically the current levels considered herein for the main electromagnet are between approximately 1,000 amperes and 2,000 amperes. However, in certain applications, such as NMR imaging, it is desirable to be able to set the current more accurately, for example, to one part in one million. Such an accuracy in current setability is not achievable simply through the use of the main switch described above. In particular, since this switch must be thermally isolated from the cryogenic medium, its response time characteristics cannot be sufficiently controlled to effect the desired current adjustment. In particular, it is commonly the case that once a transition to the resistive state has been initiated, a main switch cannot be returned to the superconducting state independently of the heater input, until after the main coil circuit current has been essentially reduced to zero.

Accordingly, it is seen that there is a need for precise adjustment of the current in a superconducting loop. This precision is also seen not to be readily providable through the control of the power supply or the main current switch.

SUMMARY OF THE INVENTION

In accordance with a preferred embodiment of the present invention, the switch for fine adjustment of current in a persistent current superconducting loop comprises a length of superconductor disposed on a substrate on which there is provided means to heat at least a portion of the superconductor. The superconductor is mounted on an external portion of the substrate so as to be readily exposable to a cryogenic coolant, such as liquid helium. The superconductive segment also preferably has attached thereto a parallel, resistive path which acts as a stabilizer to control heat and current flow in such a way that the device of the present invention is cryostable in the absence of heater input power. Furthermore, the superconductor is preferably electrically insulated from the means for heating, which is preferably disposed within a recess or channel machined or molded into the substrate which preferably comprises a material such as epoxy and glass fiber. In accordance with another embodiment of the present invention, a superconductive electromagnet circuit employs the switch of the present invention in series with either an electromagnet coil or the main superconducting current switch.

Accordingly, it is an object of the present invention to provide a means for precise control of electrical current and magnetic fields, particularly in NMR imaging and spectroscopic systems.

It is still a further object of the present invention to provide an electric circuit for use in NMR imaging and spectroscopy.

It is yet another object of the present invention to provide a superconducting switch element exhibiting a rapid transition from the superconductive and to the resistive state and vice versa.

It is still a further object of the present invention to provide a rapidly controllable switch for precisely dissipating measured amounts of electrical energy in a superconducting circuit carrying a persistent current.

BRIEF DESCRIPTION OF THE DRAWINGS

The subject matter which is regarded as the invention is particularly pointed out and distinctly claimed in the concluding portion of the specification. This invention, however, both as to organization and method of practice, together with further objects and advantages thereof, may best be understood by reference to the following description taken in connection with the accompanying drawings in which:

DETAILED DESCRIPTION OF THE INVENTION

The design of the switch of the present invention is based upon the desirability to achieve rapid switching between the resistive and superconducting states in a conductor which is capable of exhibiting both. Another important object of the present invention is the dissipation of relatively small amounts of energy in the switch, during its operation in the resistive state. For example, by controllably introducing a very small resistance in the superconducting circuit path, the current can be reduced at a very slow rate, for example one part per million per second. The total current change can then be readily controlled by controlling the length of time that the switch of the present invention is permitted to operate in the resistive state. This controllability is not present in main current switches, such as are described above, and which are used for establishing the persistent current in the loop, since these switches must be thermally isolated from the cryogenic fluid. Accordingly, their transition response times are inadequate to achieve the results desired in switches of the present design. Moreover, they are designed so that once a transition to the resistive state has been initiated by a heater, the resistive state can not be recovered simply by removing the source of heater power. Rather, the current through the main current path through the switch must be substantially reduce because of $I^2R$ heating effects.

Figure 1:
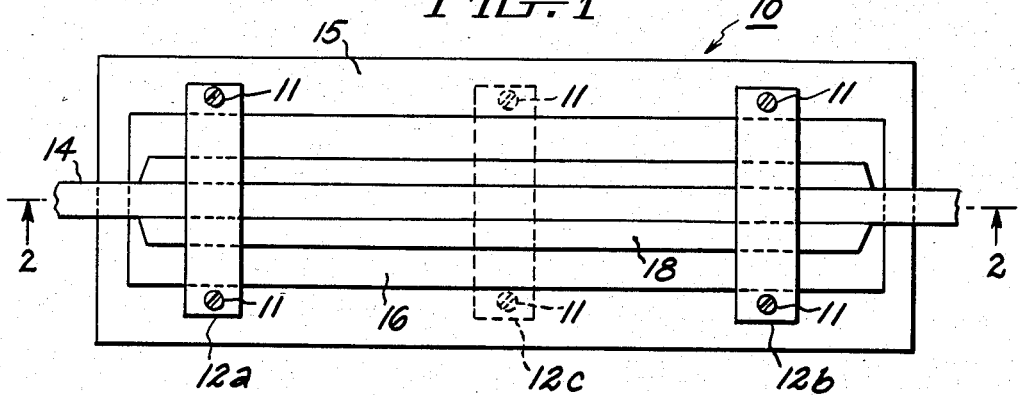
FIG. 1 is a plan view illustrating the switch of the present invention.

FIG. 1 illustrates one embodiment of the present invention showing the construction of current adjustment switch 10. In particular there is shown length 14 of superconductor material. This length of superconductive material preferably comprises an existing lead portion from a superconducting device such as an electromagnet coil. Superconductor 14 is disposed against substrate 15 by means of hold-down brackets 12a, 12b, and 12c (the exact number of brackets being optional). The brackets are fixed to substrate 15 by means of screw fastening means 11 or any other convenient fastening device. Although not visible in FIG. 1, a strip of heater material 20 is disposed beneath superconductive conductor 14. Superconductor 14 is electrically insulated from heater 20 by means of insulating sheet 16 comprising material such as Kapton®. In general, though, insulating sheet 16 preferably comprises material having sufficient electrical insulating properties. The electrically insulating properties of sheet 16 are not critical in that large potential differences across this sheet are not generally developed. However, it is generally desirable that sheet 16 comprise a material which does not exhibit excessive levels of thermal insulation. In part, to the extent that the thermally insulating properties of the material in sheet 16 are excessive, it may be possible to reduce the thickness of the sheet so as to maximize thermal transfer between the heater element and the length of superconductor 15. Substrate 15 preferably comprises a material such as epoxy and glass fiber. Likewise, brackets 12a, 12b, and 12c preferably comprise the same or similar material. Nonetheless, it is also possible to employ metal in brackets 12a, 12b, and 12c.

There are two significant aspects of the present invention illustrated in FIG. 1. The first is that the length of superconductor 14 is disposed on an external portion of the substrate. This provides the capability for superconductor 14 to be in close thermal contact with the cryogenic fluid. This permits a rapid and controlled return to the superconducting state. Furthermore, stabilizing conductors 18 also comprise a significant aspect of the present invention. The active section of the switch must be cryostable at the maximum operating current. That is, if the superconducting circuit is presumed to be carring the maximum operating current with the superconductor 14 presumed to be in a resistive state, the steady state temperature of the conductor must be below the superconducting transition temperature for that conductor at the operating current, taking into account any magnetic field at the conductor. To achieve this condition it is generally necessary to provide a parallel conductive path for the current. In FIG. 1 this path is provided by stabilizing conductors 18 shown soldered to opposite sides of superconductor 14. Additionally, it is also possible to provide this parallel conducting path in the form of a separate circuit element. More particularly, when the heating element of the switch of the present invention is turned on there are two heat sources for the length of superconductor 4. In particular, there is the heating element itself which is disposed directly below it beneath insulating sheet 16. Furthermore, there is the co-called $I^2R$ heating which occurs in the resistive state of superconductor 14. This aspect does not pose problems when the switch is being changed from the superconducting to the resistive state. However, thermal balance considerations must be considered in the transition from the resistive state to the superconducting state so that $I^2R$ heating loss is not sufficient to prevent return of superconductor 14 to the superconducting state. Naturally, the dimensions of the stabilizing conductor or conductors depend upon the size of the current in the cross-section of the superconductor together with heat flow rates and the specific geometry of the device.

With respect to device geometry, it is specifically noted that while superconductor 14 is disposed on a flat, electrically insulating substrate, it is also possible to dispose superconductor 14 on other substrate geometries. For example, a cylindrical substrate may also be provided, particularly if the current level dictates a relatively long length for superconductor 14.

Figure 2:
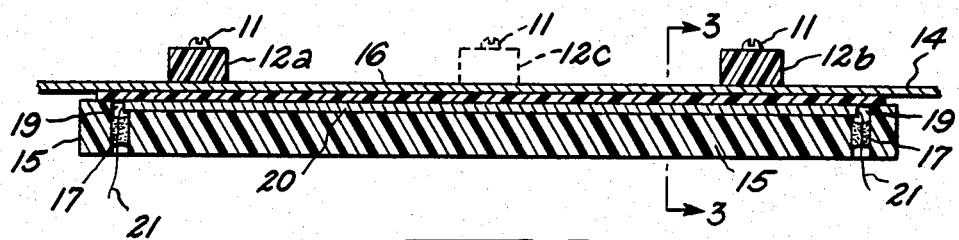
FIG. 2 is a cross-sectional side elevation view of the switch of FIG. 1.

The placement of heater 20 in channel 19 in substrate 15 is more particularly illustrated in FIG. 2. Heater 20 is shown disposed so as to lie in close proximity to the length of superconductor 14 which is disposed between fold-down brackets 12a and 12b. This placement provides rapid heating of superconductor 14 while at the same time substrate 15 acts to thermally insulate the cryogenic fluid from an exposure to undesirable temperatures on the lower side of the substrate. Heater 20 preferably comprises a resistive strip comprising material such as nichrome. Leads 21 are affixed to the strip and extend through vertical channels in substrate 15 for connection to an external electrical power source. To provide further thermal insulation between the heater and the cryogenic fluid, the channels for leads 21 are preferably filled with a plug of material such as wax or sealing grease 17. Such materials are naturally quite solid at cryogenic temperatures. The length of superconductor 14 which is in close thermal contact with heater 20 is also illustrated in FIG. 2.

Figure 3:
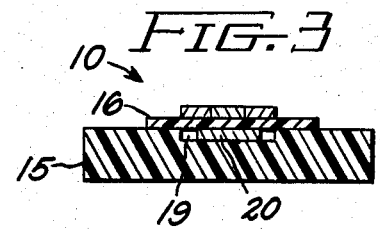
FIG. 3 is a cross-sectional view taken through a portion of the view in FIG. 2.

An additional view of the switch of the present invention is provided in FIG. 3. In particular, FIG. 3 is particularly illustrative of the relative dimensions for stabilizing conductors 18 and superconductor 14.

As shown in FIGS. 1-3, it is particularly seen that the close proximity of superconductor 14 to heater 20 provides a means to rapidly switch the device from the superconducting to the resistive state. On the other hand, the close proximity and exposure of superconductor 14 to a cryogenic fluid together with its presence in close proximity to stabilizing conductors 18 provide a means for rapid transition of the device from the resistive to the superconducting state in spite of the presence of $I^2R$ losses which may still nonetheless be present in conductor 14 which may be in the resistive state for a period even after heater 20 has been turned off. Thus the ability to rapidly and precisely control the on and off times of switch 10 is seen to make it particularly suitable for controlling and adjusting persistent currents in superconducting current loops.

Figure 4:
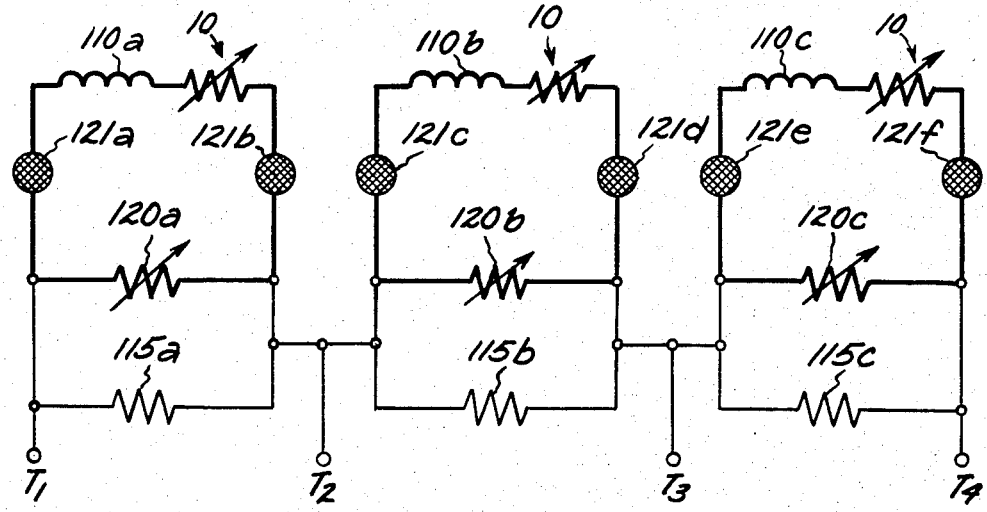
FIG. 4 is an electric circuit employing the switch of the present invention.

A circuit in which switch 10 is particularly employable is shown in FIG. 4. In particular, there are shown therein three superconductive current loops, each of which includes coil (such as an electromagnet coil) 110a, 110b, or 110c together with a main switch 120a, 120b, or 120c respectively disposed across the corresponding coil. Additionally, joints 121a, 121b, 121c, 121d, 121e, and 121f are particularly seen to be superconducting joints. The superconductive paths are shown as heavy lines in FIG. 4. Small circles indicate resistive joints either between resistive conductors or between a resistive conductor and a superconductor. Where a resistive joint is shown joining a superconductive element, it is understood that the superconductive path exists between the superconductive elements at that point. Power is supplied to establish the current in the respective coils through conventional resistive connections $T_1$, $T_2$, $T_3$, and $T_4$, as shown. Additionally, conventional protective resistive elements 115a, 115b, and 115c are also shown disposed in parallel with main switches 120a, 120b, and 120c respectively. More particularly, with respect to the present invention, switch 10 is shown disposed in a series connection with coil 110a, 110b and 110c. In general, in such a multicoil electromagnet circuit as illustrated in FIG. 4, it is generally desirable to employ switch 10 in each one of the persistent current loops. However, while switch 10 is shown connected in series in a position immediately adjacent to the coils, it is also possible to employ switch 10 in circuit locations immediately adjacent, and in series with, switches 120a, 120b, and 120c. Furthermore, as indicated above, it is also preferable to employ the coil or switch conductor itself as part of the fine adjustment switch.

From the above, it should be appreciated that the fine adjustment switch of the present invention achieves its stated objects. In particular, it is seen that the switch of the present invention provides a means for a rapid transition to and from the resistive and superconductive states. It is further seen that the time for which the switch of the present invention is in the resistive state may be carefully controlled so as to easily permit the adjustment of persistent current in the superconducting loop. However, it should be borne in mind that the adjustment of the present invention is, of necessity, an adjustment in one direction only. However, if the current is reduced to a level below that which is desired, it is always possible to reconnect the current power supply to the circuit to effect the desired change. It is also seen that the present invention is readily fabricatable from inexpensive materials and may in fact be advantageously formed in part from existing portions of the superconducting coil leads.

While the invention has been described in detail herein, in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A switch for fine adjustment of current in persistent current superconducting loops comprising:
 a length of superconductive material;
 a substrate, said length of superconductive material being disposed on an external surface thereof;
 means to heat at least a portion of said length of superconductive material; and
 means for electrically insulating said superconductive material from said heat means, whereby said superconductive material may be exposed to cryogenic coolants in which said switch may be disposed so that rapid switching between resistive and superconductive states may be effected.

2. The switch of claim 1 further including a length of resistively conductive material disposed along said length of superconductive material and in electrical contact therewith at least a portion thereof.

3. The switch of claim 1 in which said substrate is flat.

4. The switch of claim 1 in which said substrate comprises epoxy and glass fiber.

5. The switch of claim 1 in which said substrate has a channel therein adjacent to the length of said superconductive material, in which channel said heat means is disposed so as to be in close thermal contact with said superconductive material.

6. The switch of claim 5 in which said heat means comprises a length of nichrome conductor disposed within said channel.

7. The switch of claim 1 in which said insulating means comprises a thin, electrically insulating sheet disposed between said superconductive material and said heat means.

8. The switch of claim 1 further including a plurality of brackets holding said superconductive material to said substrate.

9. An adjustable superconductive current loop comprising:
 a superconductive coil disposed within a cryogenic coolant;
 a main superconductive switch connected across said superconductive coil and thermally insulated from said coolant; and
 the switch of claim 1 connected in series with said main switch and disposed within said cryogenic coolant so as said superconductive material is in thermal contact with said coolant along a substantial portion of its length.

* * * * *